United States Patent
Ku

(10) Patent No.: US 7,916,562 B2
(45) Date of Patent: Mar. 29, 2011

(54) CLOCK DRIVER DEVICE AND SEMICONDUCTOR MEMORY APPARATUS HAVING THE SAME

(75) Inventor: Kie Bong Ku, Ichon (KR)

(73) Assignee: Hynix Semiconductor Inc. (KR)

( * ) Notice: Subject to any disclaimer, the term of this patent is extended or adjusted under 35 U.S.C. 154(b) by 261 days.

(21) Appl. No.: 12/345,120

(22) Filed: Dec. 29, 2008

(65) Prior Publication Data

US 2009/0316503 A1   Dec. 24, 2009

(30) Foreign Application Priority Data

Jun. 24, 2008  (KR) .................. 10-2008-0059862

(51) Int. Cl.
*G11C 7/00* (2006.01)
(52) U.S. Cl. ............. 365/194; 365/233.1; 365/189.07; 365/233.17
(58) Field of Classification Search ............ 365/194, 365/233.1, 189.07, 233.17; 327/158
See application file for complete search history.

(56) References Cited

U.S. PATENT DOCUMENTS

| | | | |
|---|---|---|---|
| 6,650,594 B1 * | 11/2003 | Lee et al. | .......... 365/233.1 |
| 6,678,206 B2 | 1/2004 | Chu et al. | |
| 6,987,699 B2 | 1/2006 | Lee | |

FOREIGN PATENT DOCUMENTS

| | | |
|---|---|---|
| JP | 2007-095267 | 4/2007 |
| KR | 1019980083817 | 5/1998 |
| KR | 1020010048881 | 6/2001 |
| KR | 1020060054610 | 5/2006 |
| KR | 1020070036560 A | 4/2007 |

\* cited by examiner

*Primary Examiner* — David Lam
(74) *Attorney, Agent, or Firm* — Baker & McKenzie LLP

(57) ABSTRACT

A clock driver device includes a driving controller configured to generate a clock output enable signal enabled in response to an internal read pulse signal and disabled in response to a data output enable signal and an internal clock signal, and a clock driver configured to generate a driving clock signal by driving the internal clock signal in response to the clock output enable signal and a power-down signal.

23 Claims, 7 Drawing Sheets

CLOCK DRIVER DEVICE AND SEMICONDUCTOR MEMORY APPARATUS HAVING THE SAME

CROSS-REFERENCES TO RELATED PATENT APPLICATION

The present application claims priority under 35 U.S.C. 119(a) to Korean Application No. 10-2008-0059862, filed on Jun. 24, 2008, in the Korean Intellectual Property Office, which is incorporated herein by reference in its entirety as if set forth in full.

BACKGROUND

1. Technical Field

The embodiments described here relate to a semiconductor memory apparatus, and more specifically, to a clock driver device for a semiconductor memory apparatus.

2. Related Art

In general, a semiconductor memory apparatus is configured to include a clock generation circuit, such as a delay locked loop (DLL) circuit or a phase locked loop (PLL) circuit, to generate an internal clock signal having a phase leading by a predetermined time in comparison to an external clock signal. For example, in a double data rate synchronous dynamic random access memory (DDR SRAM) device, the internal clock signal output from the clock generation circuit includes a rising clock signal and a falling clock signal, wherein the rising clock signal has a phase opposite to the falling clock signal. The rising clock signal is used to output data from the rising edge of the external clock signal in a data output buffer, and the falling clock signal is used to output data from the falling edge of the external clock signal in the data output buffer.

In order to transfer the rising clock signal and the falling clock signal, which are output from the clock generation circuit, to the data output buffer, it is necessary to drive the clock generation circuit by a driver. Accordingly, the semiconductor memory apparatus commonly include a clock driver to drive the rising clock signal and the falling clock signal. Here, the clock driver is designed to be activated when an active command signal is input and deactivated when a precharge command signal is input, such that it is operated only in an active mode.

FIG. 1 is an operational timing diagram of a conventional semiconductor memory apparatus. In FIG. 1, a rising clock signal 'rclk' and a falling clock signal 'fclk' generated from the clock generation circuit are generated to have a phase leading by a delayed amount generated while each of the rising clock signal 'rclk' and a falling clock signal 'fclk' is transferred to the data output buffer. However, a glitch in the data output buffer can occur since a high section of the rising clock signal 'rclk' and the falling clock signal 'fclk' is narrower than a low section thereof.

The clock driver generates a clock output enable signal 'ckoen', which is enabled when an active command signal 'act' is input and disabled when a precharge command signal 'pcg' is input, and drives the rising clock signal 'rclk' and the falling clock signal 'fclk' only in a section where the clock output enable signal 'ckoen' is enabled to output a rising driving clock signal 'rdclk' and a falling driving clock signal 'fdclk'. However, the active command signal 'act' is commonly input to other semiconductor memory apparatuses in a memory module.

FIG. 2 is a schematic block diagram of a conventional semiconductor memory apparatus. In FIG. 2, clock enable signals 'cke<1:5>', which instruct an entry to a power-down mode, are individually input to first to fifth semiconductor memory apparatuses 2 to 6 arranged in a memory module 1, but the active command signal 'act' is commonly input thereto. Accordingly, a situation where the active command signal 'act' is input to any one semiconductor memory apparatus entering the power-down mode among the first to fifth semiconductor memory apparatuses 2 to 6 can occur. Since the clock driver is operated in response to only the active command signal 'act', such that the clock driver included in the semiconductor memory apparatus can be continuously activated despite the power-down mode, power consumption increases.

In the semiconductor memory apparatus, the clock driver is considerably spaced apart from the data output buffer. Accordingly, a length of a transmission line between the clock driver and the data output buffer increases. Even though the data output operation is not actually performed due to several reasons, such as the entry into the power-down mode, if the clock driver continuously supplies the rising driving clock signal and the falling driving clock signal to the data output buffer, then current consumption occurs along the transmission line with a relatively long clock signal.

SUMMARY

A semiconductor memory apparatus and a clock driver device for a semiconductor memory apparatus capable of reducing power consumption is described herein.

In one aspect, a clock driver device includes a driving controller configured to generate a clock output enable signal enabled in response to an internal read pulse signal and disabled in response to a data output enable signal and an internal clock signal, and a clock driver configured to generate a driving clock signal by driving the internal clock signal in response to the clock output enable signal and a power-down signal.

In another aspect, a semiconductor memory apparatus includes a clock generation circuit configured to generate an internal clock signal by controlling a phase of an external clock signal, a clock driver configured to generate a driving clock signal by driving the internal clock signal in response to an internal read pulse signal, a transmission line configured to transmit the driving clock signal, and a data output buffer configured to buffer an output data by using the driving clock signal transmitted along the transmission line.

In another aspect, a semiconductor memory apparatus includes a clock generation circuit configured to generate a rising clock signal and a falling clock signal by controlling a phase of an external clock signal, a driving controller that responds to a power-up signal, a data output enable signal, one of the rising clock signal and the falling clock signal, and a internal read pulse signal to generate a clock output enable signal, a plurality of clock drivers, each configured to generate one of a rising driving clock signal by driving the rising clock signal in response to a power-down signal, a chip active signal, and the clock output enable signal, and a falling driving clock signal by driving the falling clock signal in response to the power-down signal, the chip active signal, and the clock output enable signal, and a data output buffer configured to buffer output data by using one of the rising driving clock signal and the falling driving clock signal.

These and other features, aspects, and embodiment are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
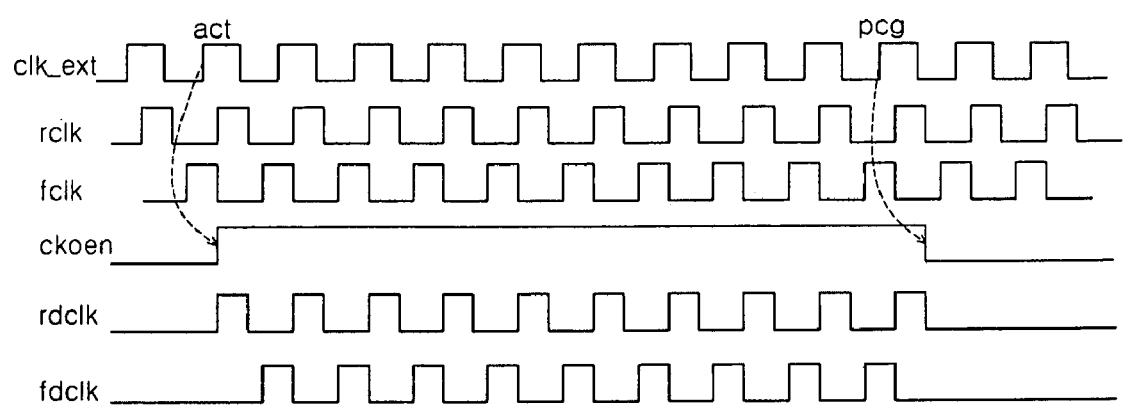
FIG. 1 is an operational timing diagram of a conventional semiconductor memory apparatus.
Figure 2:
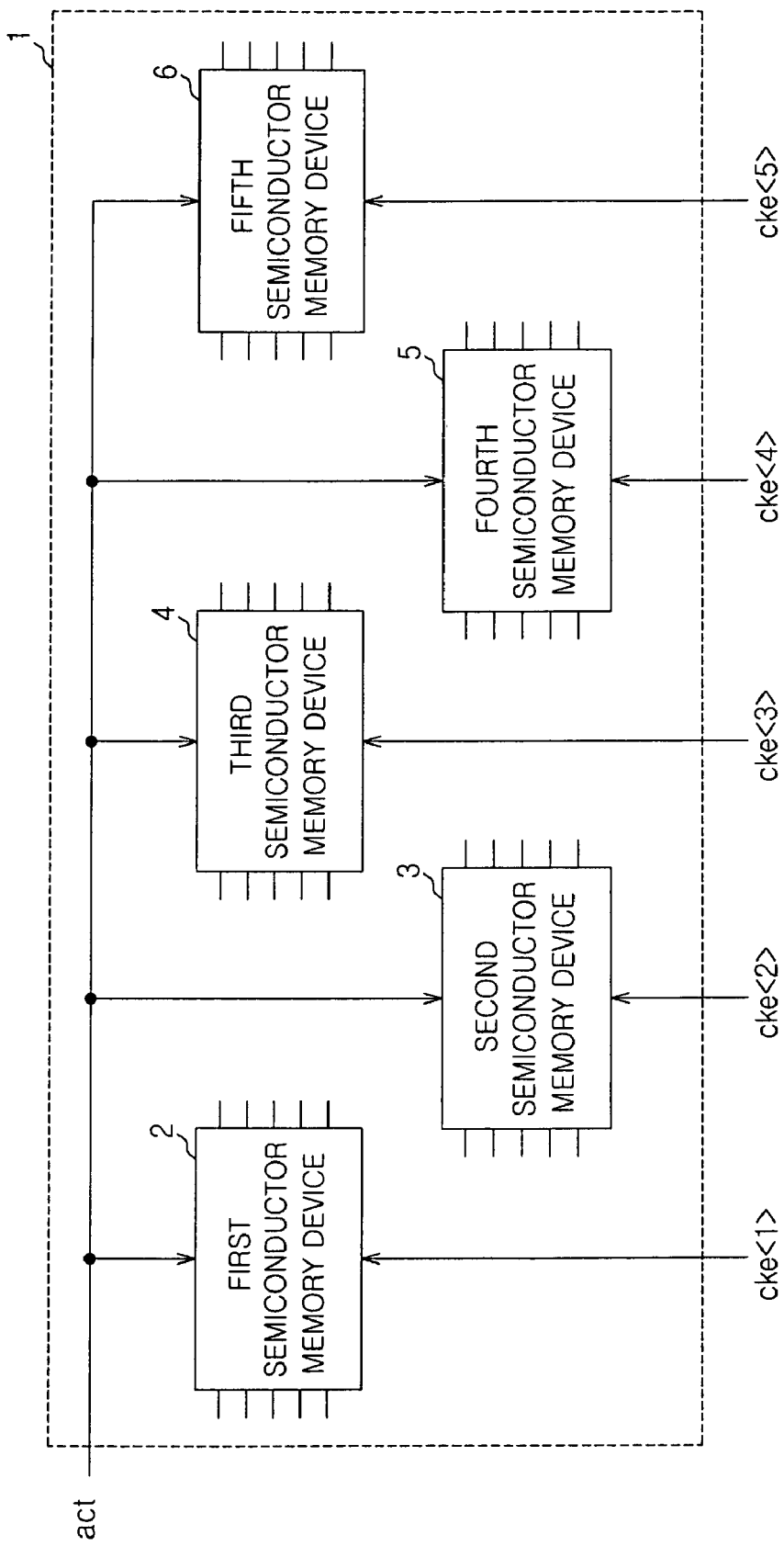
FIG. 2 is an schematic block diagram of a conventional semiconductor memory apparatus.
Figure 3:
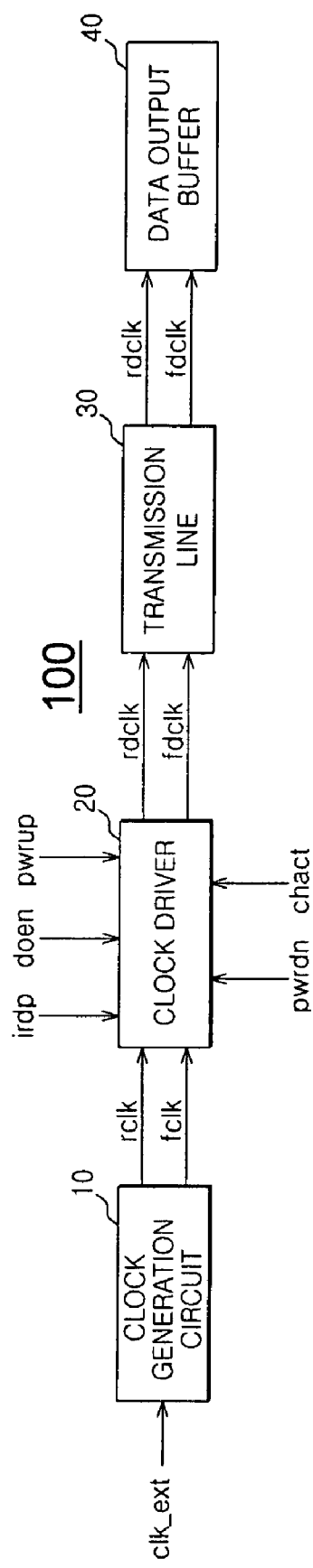
FIG. 3 is a schematic block diagram of an exemplary semiconductor memory apparatus according to one embodiment.

FIG. 3 is a schematic block diagram of an exemplary semiconductor memory apparatus 100 according to one embodiment. In FIG. 3, a semiconductor memory apparatus 100 can be configured to include a clock generation circuit 10, a clock driver device 20, a transmission line 30, and a data output buffer 40.

The clock generation circuit 10 can be configured to generate a rising clock signal 'rclk' and a falling clock signal 'fclk' by controlling a phase of an external clock signal 'clk_ext'.

The clock driver device 20 can be configured to generate a rising driving clock signal 'rdclk' and a falling driving clock signal 'fdclk' by driving the rising clock signal 'rclk' and the falling clock signal 'fclk' in response to an internal read pulse signal 'irdp', a data output enable signal 'doen', a power-up signal 'pwrup', a power-down signal 'pwrdn', and a chip active signal 'chact'.

In FIG. 3, the transmission line 30 can transmit the rising driving clock signal 'rdclk' and the falling driving clock signal 'fdclk', and the data output buffer 40 can be configured to buffer the output data by using the rising driving clock signal 'rdclk' and the falling driving clock signal 'fdclk' transmitted along the transmission line 30.

The clock generation circuit 10 can be a DLL circuit or a PLL circuit, for example. The internal read pulse signal 'irdp' can be a signal generated from a read command signal that can be input to the semiconductor memory apparatus 100 that can perform a function of instructing the read operation at an interior of the chip. The data output enable signal 'doen' can define a data output section and can have an enable section that corresponds to additive latency, wherein, as shown in Equation (1):

(AL(Additive Latency)+CL (CAS Latency)+BL (Burst Length))/2 can be defined in the semiconductor memory apparatus 100. Here, Additive Latency is a standby time after an input of an external command signal, CAS latency is the ratio between column access time and the clock cycle time, and Burst Length is the size of a data block that is transferred in response to a request.

The power-up signal 'pwrup' is a signal that informs a start of the operation of the semiconductor memory apparatus. Conversely, the power-down signal 'pwrdn' is a signal that instructs an entry into the power-down mode, and can be enabled in the power-down mode by a clock enable signal 'CKE' as well as in a self refresh mode. The chip active signal 'chact' is a signal that defines the active mode of the semiconductor memory apparatus, and can be disabled in the precharge mode and enabled in the active mode.

In FIG. 3, operation of the clock driver device 20 can be determined by the internal read pulse signal 'irdp'. For example, when the internal read pulse signal 'irdp' is enabled, the clock driver device 20 can drive the rising clock signal 'rclk' and the falling clock signal 'fclk', which can be output from the clock generation circuit 10, to perform the operation that generates the rising driving clock signal 'rdclk' and the falling driving clock signal 'fdclk'. Conversely, when the internal read pulse signal 'irdp' is not enabled, the clock driver device 20 may not perform the driving operation for the rising clock signal 'rclk' and the falling clock signal 'fclk', such that rising driving clock signal 'rdclk' and the falling driving clock signal 'fdclk' can have a ground power supply VSS level. Accordingly, the clock driver device 20 can perform the driving operation for the various clock signals during the actual read operation, i.e., only in a section where the data output buffer 40 requires the rising driving clock signal 'rdclk' and the falling driving clock signal 'fdclk'. Thus, the rising driving clock signal 'rdclk' and the falling driving clock signal 'fdclk' may not be generated in an unnecessary section, making it possible to reduce unnecessary current consumption.

In FIG. 3, the transmission line 30 can be provided with buffers or receivers for preventing signal transmission losses. Accordingly, since the clock driver device 20 can be operated only in a necessary section, unnecessary current consumption through the transmission line 30 can be prevented, thereby further improving power efficiency.

Figure 4:
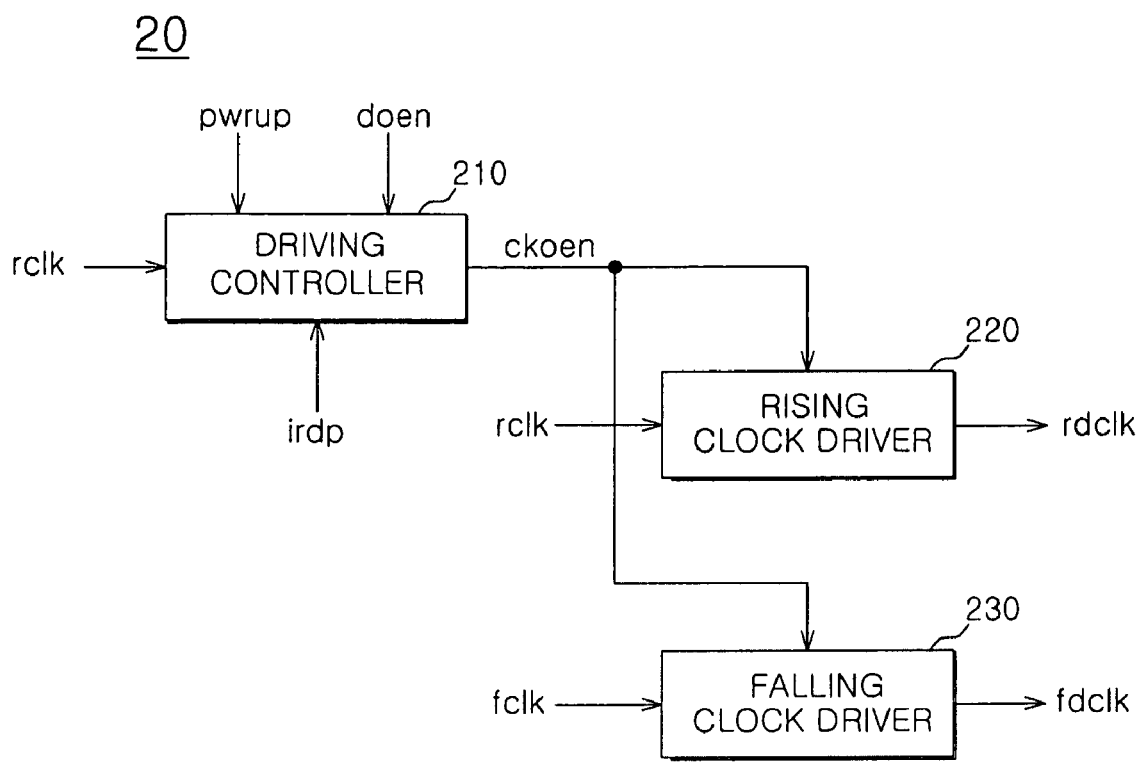
FIG. 4 is a schematic block diagram of an exemplary clock driver capable of being implemented in the apparatus of FIG. 3 according to one embodiment.

FIG. 4 is a schematic block diagram of an exemplary clock driver 20 capable of being implemented in the apparatus of FIG. 3 according to one embodiment. In FIG. 4, the clock driver device 20 can be configured to include a driving controller 210, a rising clock driver 200, and a falling clock driver 230.

The driving controller 210 can be configured to generate a clock output enable signal 'ckoen' in response to the power-up signal 'pwrup', the data output enable signal 'doen', the rising clock signal 'rclk', and the internal read pulse signal 'irdp'.

The rising clock driver 220 can be configured to generate the rising driving clock signal 'rdclk' by driving the rising clock signal 'rclk' in response to the power-down signal 'pwrdn', the chip active signal 'chact', and the clock output enable signal 'ckoen'. Similarly, a falling clock driving time 230 can be configured to generate the falling driving clock signal 'fdclk' by driving the falling clock signal 'fclk' in response to the power-down signal 'pwrdn', the chip active signal 'chact', and the clock output enable signal 'ckoen'.

In FIG. 4, the clock output enable signal 'ckoen' generated from the driving controller 210 can be enabled in response to the internal read pulse signal 'irdp', and can be disabled in response to the data output enable signal 'outen' and the rising clock signal 'rclk'. For example, the clock output enable signal 'ckoen' can start an enable section when the internal read pulse signal 'irdp' is enabled, wherein the data output enable signal 'doen' can also start an enable section. The data output enable signal 'doen' can be enabled during a section corresponding to Equation (1), AL+CL+BL/2 of the semiconductor memory apparatus 100, as described above. When the data output enable signal 'doen' is disabled, the clock output enable signal 'ckoen' can be disabled at the time point of a falling edge of the rising clock signal 'rclk'. Here, although the driving controller 210 can generate the clock output enable signal 'ckoen' by using the rising clock signal 'rclk', the driving controller 210 can also use the falling clock signal 'fclk'.

In FIG. 4, the rising clock driver 220 and the falling clock driver 230 can drive the rising clock signal 'rclk' and the falling clock signal 'fclk', respectively, by using the clock output enable signal 'ckoen'. The clock output enable signal 'ckoen' can be implemented as the enabled signal only when the read operation is actually performed in the semiconductor memory apparatus 100, such that the rising clock driver 220 and the falling clock driver 230 can be operated only in a section where the data output buffer 40 requires the rising driving clock signal 'rdclk' and the falling driving clock signal 'fdclk'. Accordingly, unnecessary current consumption can be further reduced.

Figure 5:
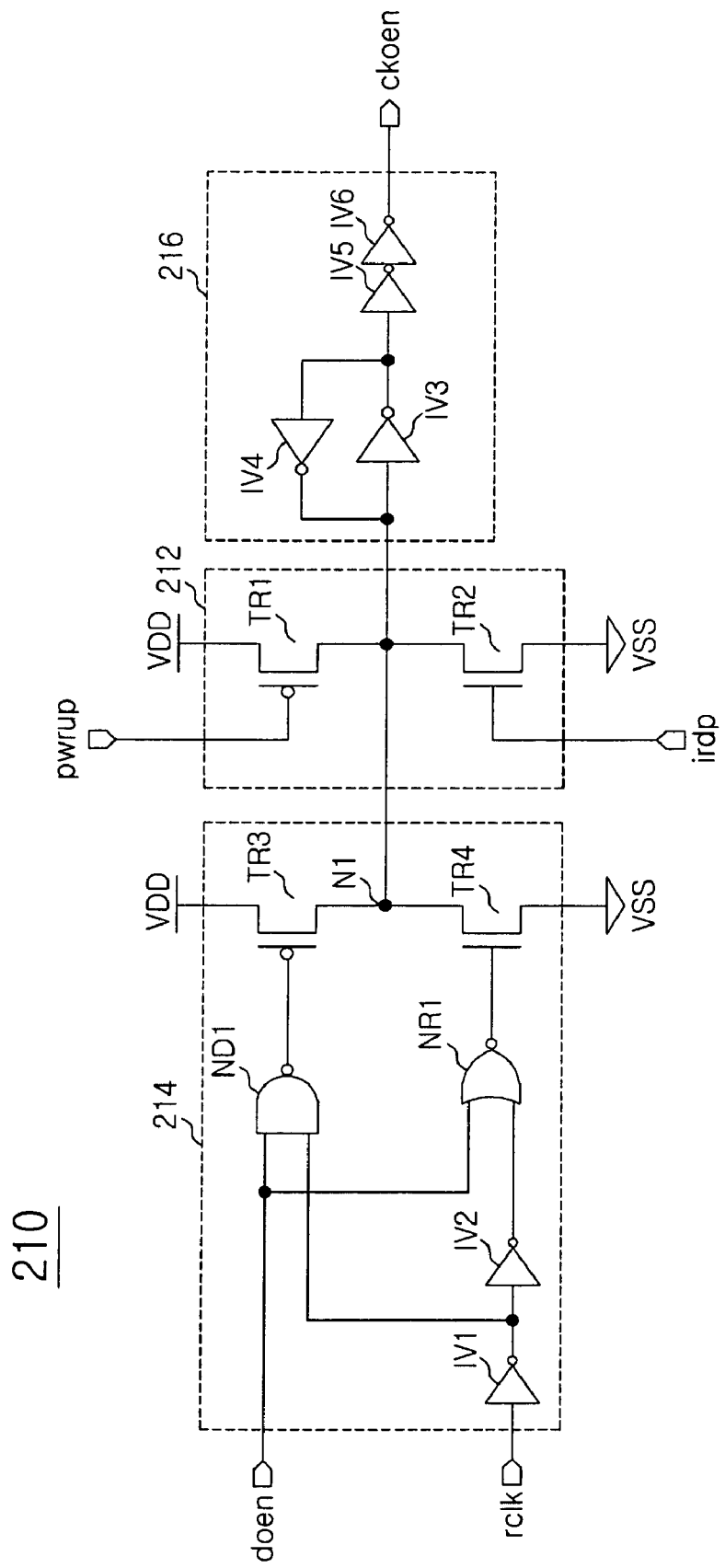
FIG. 5 is a schematic block diagram of an exemplary driving controller capable of being implemented in the driver of FIG. 4 according to one embodiment.

FIG. 5 is a schematic block diagram of an exemplary driving controller 210 capable of being implemented in the driver of FIG. 4 according to one embodiment. In FIG. 5, the driving controller 210 can be configured to include a first node (N1), an enable setting unit 212, a disable setting unit 214, and a signal generator 216.

The enable setting unit 212 can respond to the power-up signal 'pwrup' and the internal read pulse signal 'irdp' to control the potential of the first node (N1). In addition, the disable setting unit 214 can respond to the data output enable signal 'doen' and the rising clock signal 'rclk' to control the potential of the first node (N1). The signal generator 216 can latch and drive the potential of the first node (N1) to generate the clock output enable signal 'ckoen'.

The enable setting unit 212 can be configured to include a first transistor TR1 having a gate terminal receiving the power-up signal 'pwrup', a source terminal supplied with external supply power VDD, and drain terminal connected to the first node (N1). In addition, the enable setting unit 212 can be configured to include a second transistor TR2 having a gate terminal receiving the internal read pulse signal 'irdp', a drain terminal connected to the first node (N1), and a source terminal connected to ground.

In FIG. 5, the disable setting unit 214 can be configured to include a first inverter IV1, a first NAND gate ND1, a third transistor TR3, a second inverter IV2, a first NOR gate NR1, and a fourth transistor TR4.

The first NAND gate ND1 can receive the rising clock signal 'rclk', the data output enable signal 'doen', and an output signal from the first inverter IV1. The third transistor TR3 can include a gate terminal receiving an output signal from the first NAND gate ND1, a source terminal receiving the external supply power VDD, and a drain terminal connected to the first node (N1). The second inverter IV2 can receive the output signal from the first inverter IV1. The first NOR gate NR1 can receive the data output enable signal 'doen' and the output signal from the second inverter IV2. The fourth transistor TR4 can include a gate terminal receiving an output signal from the first NOR gate NR1, a drain terminal connected to the first node (N1), and a source terminal connected to ground.

The signal generator 216 can be configured to include a third inverter IV3 that receives the output signal from the first node (N1), a fourth inverter IV4 that forms a latch structure together with the third inverter IV3, a fifth inverter IV5 that receives the output signal from the third inverter IV3, and a sixth inverter IV6 that receives the output signal from the fifth inverter IV5 to output the clock output enable signal 'ckoen'.

In the driving controller 210, since the first transistor TR1 in the enable setting unit 212 can be turned-ON before the power-up signal 'pwrup' is enabled, the potential of the first node (N1) can become a high level. Accordingly, the clock output enable signal 'ckoen' can be disabled at a low level. Thus, if the power-up signal 'pwrup' is enabled, then power is no longer supplied to the first node (N1).

When the internal read pulse signal 'irdp' is enabled, the potential of the first node (N1) can be transitioned to a low level and the clock output enable signal 'ckoen' can be enabled at a high level. Even when the potential of the internal read pulse signal 'irdp' returns to a low level, the enable state of the clock output enable signal 'ckoen' can be maintained by a latch structure of the signal generator 216.

In FIG. 5, the data output enable signal 'doen', which is a low enable signal, can start the enable section when the internal read pulse signal 'irdp' is enabled. Accordingly, since the first NOR gate NR1 in the disable setting unit 214 can output the low-level signal before the internal read pulse signal 'irdp' is enabled, the potential of the first node (N1) can be maintained at a high level. When the internal read pulse signal 'irdp' is enabled, since the output signal from the first NAND gate ND1 is a high level, the potential of the first node (N1) can be maintained at the low level.

When the data output enable signal 'doen' is disabled at a high level, the output from the NAND gate ND1 can become a low level at a falling edge time of the rising clock signal 'rclk'. Accordingly, since the third transistor TR3 can be turned-ON, the first node (N1) can have the high-level potential by receiving power. As the potential of the first node (N1) becomes a high level, the signal generator 216 can disable the potential of the output enable signal 'ckoen' at a low level.

In FIG. 5, the clock output enable signal 'ckoen' can be enabled when the internal read pulse signal 'irdp' is enabled and after the data output enable signal 'done' is disabled can be implemented as a form that is disabled at the falling edge time of the rising clock signal 'rclk'. Here, the driving controller 210 can control the operations of the rising clock driver 220 and the falling clock driver 230 to be activated by the data output operation section based on the input time point of the internal read pulse signal 'irdp'.

Figure 6:
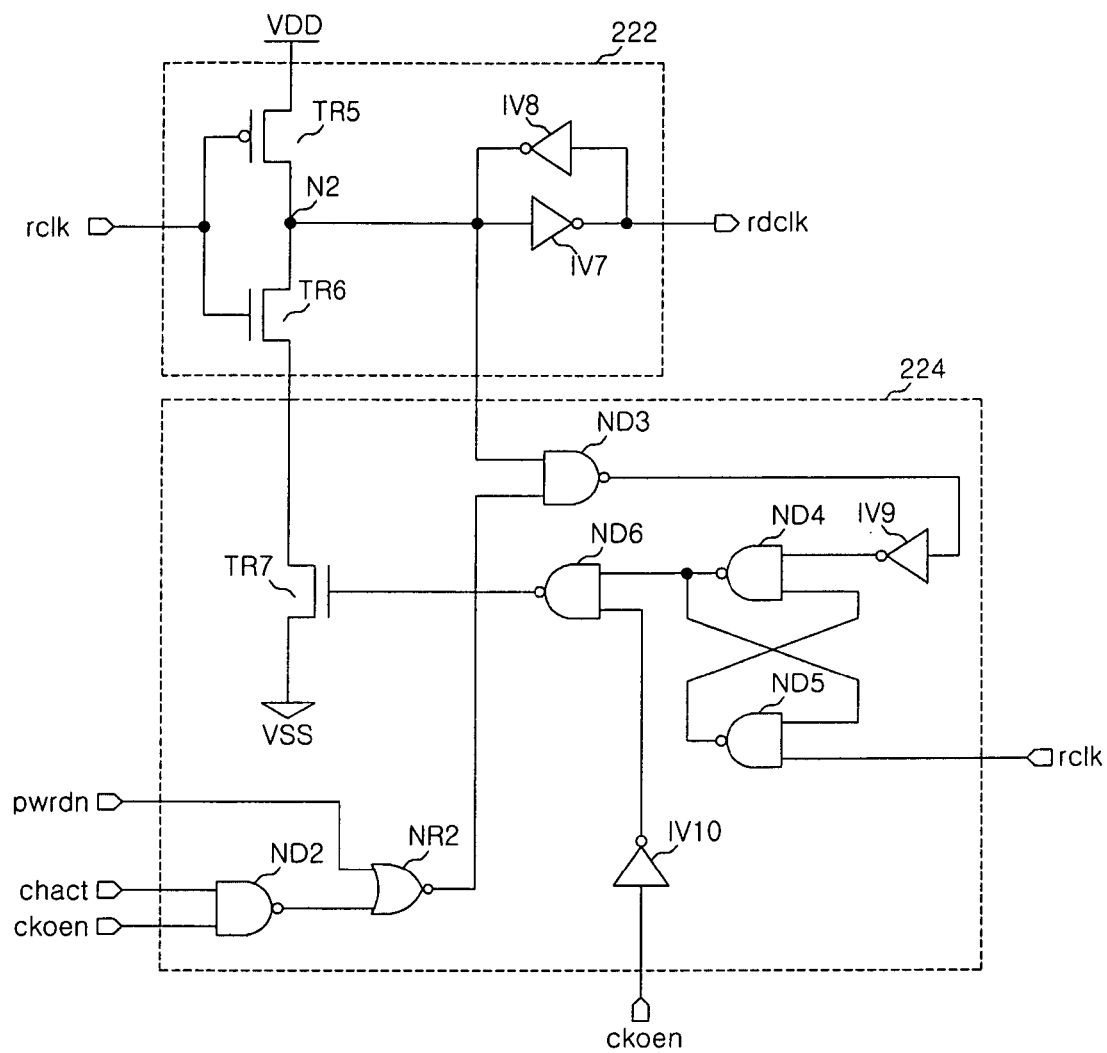
FIG. 6 is a schematic block diagram of an exemplary rising clock driving controller capable of being implemented in the driver of FIG. 4 according to one embodiment.

FIG. 6 is a schematic block diagram of an exemplary rising clock driving controller capable of being implemented in the driver of FIG. 4 according to one embodiment. In FIG. 6, since the rising clock driver 220 and the falling clock driver 230 can have substantially the same structure, except for a signal being named as the input signal and the output signal, description of the falling clock driver 230 can presumably be provided by the following description of the rising clock driver 220.

In FIG. 6, the rising clock driver 220 can be configured to include a driver 222, and a controller 224. For example, the driver 222 can drive the rising clock signal 'rclk' to generate the rising driving clock signal 'rdclk'. The controller 224 can respond to the power-down signal 'pwrdn', the chip active signal 'chact', the clock output enable signal 'ckoen', and a signal latched to the driver 222 to define the operation section of the driver 222.

The driver 222 can be configured to include a second node (N2), a fifth transistor TR5, a six transistor TR6, a seventh inverter IV7, and an eighth inverter IV8.

The fifth transistor TR5 can include a gate terminal receiving the rising clock signal 'rclk', a source terminal supplied with the external supply power VDD, and a drain terminal connected to the second node (N2). The sixth transistor TR6 can include a gate terminal receiving the rising clock signal 'rclk', a drain terminal connected to the second node (N2), and a source terminal connected to the controller 224. The seventh inverter IV7 can output the rising driving clock signal 'rdclk' by receiving the potential supplied to the second node (N2). The eighth inverter IV8 can form a latch structure together with the seventh inverter IV7.

The controller 224 can be configured to include a second NAND gate ND2, a second NOR gate NR2, a third NAND gate ND3, a ninth inverter IV9, a fourth NAND gate ND4, a fifth NAND gate ND5, a tenth inverter IV10, a sixth NAND gate ND6, and a seventh transistor TR7.

The second NAND gate ND2 can receive the chip active signal 'chact' and the clock output enable signal 'ckoen', and the second NOR gate NR2 can receive the power-down signal 'pwrdn' and the output signal from the second NAND gate ND2. The third NAND gate ND3 can receive the output signal from the second NOR gate NR2 and the potential supplied to the second node (N2). The ninth inverter IV9 can receive the output signal from the third NAND gate ND3, and the fourth NAND gate ND4 can include a first input terminal that can receive the output signal from the ninth inverter IV9. The fifth NAND gate ND5 can receive the rising clock signal 'rclk' and the output signal from the fourth NAND gate ND4, and can output the output signal to a second input terminal of the fourth NAND gate ND4. The tenth inverter IV10 can receive the clock output enable signal 'ckoen'. The sixth NAND gate ND6 can receive the output signal from the fourth NAND gate ND4 and the output signal from the tenth inverter IV10. The seventh transistor TR7 can include a gate terminal receiving the output signal from the sixth NAND gate ND6, a drain terminal connected to the source terminal of the sixth transistor TR6 in the driver 222, and a source terminal connected to ground.

In the exemplary configuration of the rising clock driver 220, in order to activate the driver 222, the seventh transistor TR7 in the controller 224 should be turned-ON. When the seventh transistor TR7 is turned-OFF, the rising driving clock signal 'rdclk' can maintain a low level by the latch structure of the driver 222.

If the semiconductor memory apparatus 100 (in FIG. 3) enters the precharge mode, then the chip active signal 'chact' can be disabled, such that the output signal from the fourth NAND gate ND4 can become a high level. Accordingly, the clock output enable signal 'ckoen' is not enabled, such that the sixth NAND gate ND6 can output a low-level signal and the seventh transistor TR7 can be turned-OFF.

When the semiconductor memory apparatus 100 (in FIG. 3) enters the power-down mode or the self refresh mode, the power-down signal 'pwrdn' can be enabled, such that the output signal from the fourth NAND gate ND4 can become a high level. Accordingly, the clock output enable signal 'ckoen' can be enabled, such that the sixth NAND gate ND6 can output a low-level signal and the seventh transistor TR7 can be turned-OFF.

When the semiconductor memory apparatus 100 (in FIG. 3) performs the read operation, the chip active signal 'chact' can be enabled and the power-down signal 'pwrdn' can be disabled. Accordingly, the output signal from the fourth NAND gate 'ND4' can be toggled due to the influence of the rising clock signal 'rclk' or the influence of the potential supplied to the second node (N2). However, since the clock output enable signal 'ckoen' is enabled, the output signal from the sixth NAND gate ND6 can become a high level and the seventh transistor TR7 can be turned-ON, such that the driving operation for the rising clock signal 'rclk' of the driver 222 can be performed.

Although not explicitly shown, it can be inferred from the exemplary configuration of the rising clock driver 220 that the falling clock driver 230 can also drive the falling clock signal 'fclk' only in a section where the clock output enable signal 'ckoen' is enabled so as to generate the falling driving clock signal 'fdclk'.

Figure 7:
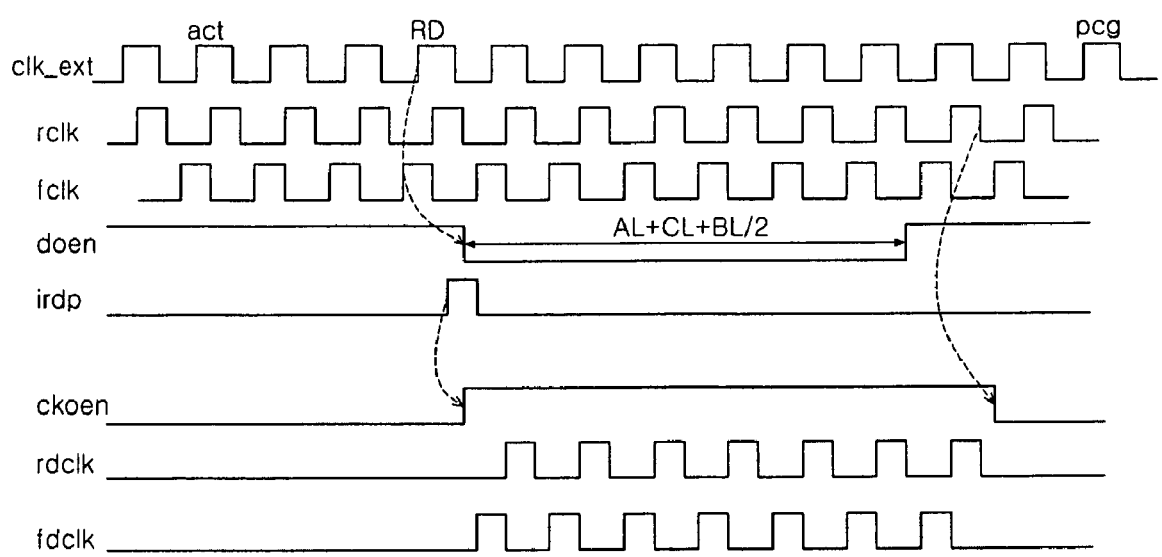
FIG. 7 is a timing diagram demonstrating an exemplary operation of the clock driver shown of FIG. 3 according to one embodiment.

FIG. 7 is a timing diagram demonstrating an exemplary operation of the clock driver shown of FIG. 3 according to one embodiment. In FIG. 7, exemplary waveforms of the external clock signal 'clk_ext' the rising clock signal 'rclk', and the falling clock signal 'fclk' are shown. Here, the data output enable signal 'doen' can be enabled at a low level when receiving a read command signal 'RD' and can have an enable section corresponding to Equation (1), AL+CL+BL/2. In addition, the internal read pulse signal 'irdp' can be enabled in response to the input of the read command signal 'RD'. Accordingly, the clock output clock enable signal 'ckoen' can start to be enabled in response to the internal read pulse signal 'irdp' and after the data output enable signal 'doen' is disabled, and can be disabled in synchronization with the falling edge time of the rising clock signal 'rclk'. The rising driving clock signal 'rdclk' and the falling driving clock signal 'fdclk' can have a valid level only in a section where the clock output enable signal 'ckoen' is enabled.

The clock driver device 20 (in FIGS. 3 and 4) can operate only in a section where the read operation is actually performed, making it possible to prevent unnecessary current consumption that is generated in the power-down mode. Accordingly, the clock driver device 20 (in FIGS. 3 and 4) can have a configuration that can be activated in response to the input of the read command signal, and can be deactivated when time corresponding to the data output section is elapsed. Thus, the semiconductor memory apparatus 100 (in FIG. 3) can reduce unnecessary current consumption that is generated along the transmission line, making it possible to efficiently improve power efficiency.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A clock driver device, comprising:
   a driving controller configured to generate a clock output enable signal enabled in response to an internal read pulse signal and disabled in response to a data output enable signal and an internal clock signal; and
   a clock driver configured to generate a driving clock signal by driving the internal clock signal in response to the clock output enable signal and a power-down signal.

2. The clock driver device of claim 1, wherein the internal read pulse signal is generated by a read command signal input from an exterior of a semiconductor memory apparatus.

3. The clock driver device of claim 1, wherein the internal clock signal is generated from one of a delay locked loop (DLL) circuit and a phase locked loop (PLL) circuit, and includes a rising clock signal and a falling clock signal.

4. The clock driver device of claim 3, wherein the data output enable signal defines a data output section and determines an enable section according to an additive latency, a CAS latency, and a burst length defined in the semiconductor memory apparatus.

5. The clock driver device of claim 3, wherein the driving controller includes:
   a first node;

an enable setting unit that responds to a power-up signal and the internal read pulse signal to control the potential of the first node;
a disable setting unit that responds to one of the rising clock signal, the falling clock signal, and the data output enable signal to control the potential of the first node; and
a signal generator that latches and drives the potential of the first node to generate the clock output enable signal.

6. The clock driver device of claim 3, further comprising a rising clock driver that includes:
a driver configured to drive the rising clock signal and to generate the rising driving clock signal; and
a controller configured to respond to the power-down signal, a chip active signal, the clock output enable signal, and a signal latched to the driver to define the operation section of the driver.

7. The clock driver device of claim 3, further comprising a falling clock that includes:
a driver configured to drive the falling clock signal and to generate the falling driving clock signal; and
a controller configured to respond to the power-down signal, a chip active signal, the clock output enable signal, and a signal latched to the driver to define the operation section of the driver.

8. The clock driver device of claim 1, wherein the power-down signal is enabled in one of a power-down mode and a self refresh mode by an instruction of the clock enable signal.

9. A semiconductor memory apparatus, comprising:
a clock generation circuit configured to generate an internal clock signal by controlling a phase of an external clock signal;
a clock driver configured to generate a driving clock signal by driving the internal clock signal in response to an internal read pulse signal;
a transmission line configured to transmit the driving clock signal; and
a data output buffer configured to buffer an output data by using the driving clock signal transmitted along the transmission line.

10. The semiconductor memory apparatus of claim 9, wherein the clock generation circuit is one of a delay locked loop (DLL) circuit and a phase locked loop (PLL) circuit, and the internal clock signal includes a rising clock signal and a falling clock signal.

11. The semiconductor memory apparatus of claim 10, wherein the driving clock signal includes the rising driving clock signal and the falling driving clock signal.

12. The semiconductor memory apparatus of claim 11, wherein the clock driver is configured to include:
a driving controller that responds to a power-up signal, a data output enable signal, one of the rising clock signal and the falling clock signal, and the internal read pulse signal to generate a clock output enable signal;
a rising clock driver that generates the rising driving clock signal by driving the rising clock signal in response to a power-down signal, a chip active signal, and the clock output enable signal; and
a falling clock driver that generates the falling driving clock signal by driving the falling clock signal in response to the power-down signal, the chip active signal, and the clock output enable signal.

13. The semiconductor memory apparatus of claim 12, wherein the data output enable signal defines a data output section and determines an enable section according to an additive latency, a CAS latency, and a burst length defined in the semiconductor memory apparatus.

14. The semiconductor memory apparatus of claim 13, wherein the driving controller is configured to generate the clock output enable signal that is enabled in response to the internal read pulse signal and disabled in response to the data output enable signal and one of the rising clock signal and the falling clock signal.

15. The semiconductor memory apparatus of claim 14, wherein the driving controller includes:
a first node;
an enable setting unit that responds to the power-up signal and the internal read pulse signal to control the potential of the first node;
a disable setting unit that responds to one of the rising clock signal and the falling clock signal and the data output enable signal to control the potential of the first node; and
a signal generator that latches and drives the potential of the first node to generate the clock output enable signal.

16. The semiconductor memory apparatus of claim 12, wherein the rising clock driver includes:
a driver that drives the rising clock signal to generate the rising driving clock signal; and
a controller that responds to the power-down signal, the chip active signal, the clock output enable signal, and a signal latched to the driver to define the operation section of the driver.

17. The semiconductor memory apparatus of claim 12, wherein the falling clock driver includes:
a driver that drives the falling clock signal to generate the falling driving clock signal; and
a controller that responds to the power-down signal, the chip active signal, the clock output enable signal, and a signal latched to the driver to define the operation section of the driver.

18. The semiconductor memory apparatus of claim 9, wherein the internal read pulse signal is generated by a read command signal input from an exterior of the semiconductor memory apparatus.

19. A semiconductor memory apparatus, comprising:
a clock generation circuit configured to generate a rising clock signal and a falling clock signal by controlling a phase of an external clock signal;
a driving controller configured to respond to a power-up signal, a data output enable signal, one of the rising clock signal and the falling clock signal, and a internal read pulse signal to generate a clock output enable signal;
a plurality of clock drivers, each configured to generate one of a rising driving clock signal by driving the rising clock signal in response to a power-down signal, a chip active signal, and the clock output enable signal, and a falling driving clock signal by driving the falling clock signal in response to the power-down signal, the chip active signal, and the clock output enable signal; and
a data output buffer configured to buffer output data by using one of the rising driving clock signal and the falling driving clock signal.

20. The semiconductor memory apparatus of claim 19, wherein the internal read pulse signal is generated by a read command signal input from an exterior of the semiconductor memory apparatus.

21. The semiconductor memory apparatus of claim 19, wherein the data output enable signal defines a data output section and determines an enable section according to an additive latency, a CAS latency, and a burst length defined in the semiconductor memory apparatus.

22. The semiconductor memory apparatus of claim 19, wherein the driving controller includes an enable setting unit that responds to the power-up signal and the internal read pulse signal to control the potential of a first node, a disable setting unit that responds to one of the rising clock signal and the falling clock signal and the data output enable signal to control the potential of the first node, and a signal generator that latches and drives the potential of the first node to generate the clock output enable signal.

23. The semiconductor memory apparatus of claim 19, wherein each of the plurality of clock drivers include:

a driver that drives one of the rising clock signal to generate the rising driving clock signal and the falling clock signal to generate the falling driving clock signal; and a controller that responds to the power-down signal, the chip active signal, the clock output enable signal, and a signal latched to the driver to define the operation section of the driver.

* * * * *